(12) United States Patent
Snyder et al.

(10) Patent No.: US 8,686,985 B2
(45) Date of Patent: Apr. 1, 2014

(54) ACTIVE LIQUID CRYSTAL DISPLAY DRIVERS AND DUTY CYCLE OPERATION

(75) Inventors: Warren Snyder, Snohomish, WA (US);
Harold Kutz, Edmonds, WA (US);
Timothy Williams, Bellevue, WA (US);
Bert Sullam, Bellevue, WA (US); David Wright, San Diego, CA (US)

(73) Assignee: Cypress Semiconductor Corporation, San Jose, CA (US)

(\*) Notice: Subject to any disclaimer, the term of this patent is extended or adjusted under 35 U.S.C. 154(b) by 1264 days.

(21) Appl. No.: 11/965,520

(22) Filed: Dec. 27, 2007

(65) Prior Publication Data

US 2008/0259070 A1    Oct. 23, 2008

Related U.S. Application Data

(60) Provisional application No. 60/912,577, filed on Apr. 18, 2007.

(51) Int. Cl.
*G09G 5/00*    (2006.01)

(52) U.S. Cl.
USPC .......................... 345/212; 345/204; 345/211

(58) Field of Classification Search
USPC ........................................ 345/204, 211, 212
See application file for complete search history.

(56) References Cited

U.S. PATENT DOCUMENTS

| | | |
|---|---|---|
| 4,571,507 A | 2/1986 | Collings |
| 4,692,760 A | 9/1987 | Unno et al. |
| 4,839,636 A | 6/1989 | Zeiss |
| 4,988,983 A | 1/1991 | Wehrer |
| 5,508,715 A | 4/1996 | Kuroki |
| 5,845,181 A | 12/1998 | Bartscher |
| 5,867,015 A | 2/1999 | Corsi et al. |
| 5,949,408 A | 9/1999 | Kang et al. |
| 6,118,439 A | 9/2000 | Ho et al. |
| 6,124,840 A | 9/2000 | Kwon |
| 6,204,831 B1 | 3/2001 | Nishioka et al. |
| 6,225,992 B1 * | 5/2001 | Hsu et al. ................ 345/211 |
| 6,701,508 B1 | 3/2004 | Bartz et al. |
| 6,801,178 B2 | 10/2004 | Nitta et al. |
| 6,812,678 B1 | 11/2004 | Brohlin |
| 6,909,414 B2 * | 6/2005 | Tsuchi et al. .............. 345/89 |
| 6,960,953 B2 | 11/2005 | Ichihara |
| 6,966,039 B1 | 11/2005 | Bartz et al. |
| 6,989,659 B2 | 1/2006 | Menegoli et al. |
| 7,010,773 B1 | 3/2006 | Bartz et al. |
| 7,319,999 B2 | 1/2008 | Evans |
| 7,348,861 B1 | 3/2008 | Wu et al. |
| 7,391,204 B2 | 6/2008 | Bicking |
| 7,397,226 B1 | 7/2008 | Mannama et al. |

(Continued)

OTHER PUBLICATIONS

The Written Opinion of the International Searching Authority for International Application No. PCT/US08/60699 mailed Jun. 18, 2009; 4 pages.

(Continued)

*Primary Examiner* — Amare Mengistu
*Assistant Examiner* — Jennifer Zubajlo

(57) ABSTRACT

A liquid crystal display (LCD) driving system includes a reference voltage generator to generate a plurality of reference voltages. The LCD driving system also includes a plurality of drive buffers to generate drive voltages according to at least one of the reference voltages, and to drive at least a portion of a liquid crystal display to present data according to the drive voltages.

19 Claims, 8 Drawing Sheets

(56) References Cited

U.S. PATENT DOCUMENTS

| | | | |
|---|---|---|---|
| 7,612,527 | B2 | 11/2009 | Hoffman et al. |
| 7,667,708 | B2 | 2/2010 | Kamijo et al. |
| 8,085,020 | B1 | 12/2011 | Bennett |
| 2001/0040569 | A1 | 11/2001 | Liang |
| 2002/0011979 | A1 | 1/2002 | Nitta et al. |
| 2002/0033804 | A1 | 3/2002 | Liang et al. |
| 2003/0112215 | A1 | 6/2003 | Hector et al. |
| 2003/0122734 | A1 | 7/2003 | Chien et al. |
| 2004/0046724 | A1 | 3/2004 | Woo et al. |
| 2004/0056833 | A1* | 3/2004 | Kitagawa et al. ............... 345/92 |
| 2004/0070559 | A1 | 4/2004 | Liang |
| 2004/0145551 | A1 | 7/2004 | Tobita |
| 2004/0189573 | A1 | 9/2004 | Lee et al. |
| 2004/0217799 | A1* | 11/2004 | Ichihara ....................... 327/333 |
| 2005/0052394 | A1 | 3/2005 | Waterman |
| 2005/0057482 | A1 | 3/2005 | Youngblood et al. |
| 2005/0140659 | A1 | 6/2005 | Hohl et al. |
| 2006/0001671 | A1 | 1/2006 | Kamijo et al. |
| 2006/0192791 | A1 | 8/2006 | Schick et al. |
| 2006/0239746 | A1 | 10/2006 | Grant |
| 2006/0244739 | A1 | 11/2006 | Tsai |
| 2007/0002007 | A1 | 1/2007 | Tam |
| 2007/0139338 | A1 | 6/2007 | Lin et al. |
| 2007/0139403 | A1 | 6/2007 | Chung |
| 2007/0159425 | A1 | 7/2007 | Knepper et al. |
| 2008/0131145 | A1 | 6/2008 | Tao et al. |
| 2008/0203977 | A1 | 8/2008 | Raimar et al. |
| 2008/0259017 | A1* | 10/2008 | Wright et al. .................. 345/94 |
| 2008/0259070 | A1 | 10/2008 | Snyder et al. |
| 2009/0054129 | A1 | 2/2009 | Yoshimura et al. |
| 2011/0234264 | A1 | 9/2011 | Wright et al. |
| 2011/0248692 | A1 | 10/2011 | Shehu et al. |

OTHER PUBLICATIONS

International Search Report International Application No. PCT/US08/60699 mailed Jun. 18, 2009; 2 pages.
U.S. Appl. No. 11/855,281 "Reducing Power Consumption in a Liquid Crystal Display," David Wright et al., filed Sep. 14, 2007; 26 pages.
U.S. Appl. No. 11/864,137 "Configurable Liquid Crystal Display Driver System," David Wrightet al., filed Sep. 28, 2007; 22 pages.
U.S. Appl. No. 11/965,485 "Display Interface Buffer," Warren Snyder et al., filed Dec. 27, 2007; 28 pages.
Jinbin Zhao, et al., "Steady-State and Dynamic Analysis of a Buck Converter Using a Hysteretic PWM Control" Dated 2004; 5 pages.
Mohammad Al-Shyoukh and Hoi Lee__A Compact Fully-Integrated Extremum-Selector-Based Soft-Start Circuit for Voltage Regulators in Bulk CMOS Technologies__Oct. 2010__5 pages.
USPTO Advisory Action for U.S. Appl. No. 11/855,281 dated Mar. 3, 2011; 4 pages.
USPTO Advisory Action for U.S. Appl. No. 11/855,281 dated Sep. 23, 2013; 3 pages.
USPTO Advisory Action for U.S. Appl. No. 11/864,137 dated Jun. 25, 2012; 4 pages.
USPTO Advisory Action for U.S. Appl. No. 11/864,137 dated Nov. 7, 2011; 3 pages.
USPTO Advisory Action for U.S. Appl. No. 11/965,485 dated Jun. 14, 2011; 3 pages.
USPTO Advisory Action for U.S. Appl. No. 11/965,485 dated Jul. 29, 2013; 3 pages.
USPTO Advisory Action for U.S. Appl. No. 11/965,485 dated Nov. 21, 2012; 3 pages.
USPTO Final Rejection for U.S. Appl. No. 11/965,485 dated Jun. 6, 2013; 15 pages.
USPTO Final Rejection for U.S. Appl. No. 11/855,281 dated Jul. 5, 2013; 9 pages.
USPTO Final Rejection for U.S. Appl. No. 11/855,281 dated Dec. 16, 2010; 13 pages.
USPTO Final Rejection for U.S. Appl. No. 11/864,137 dated Apr. 12, 2011; 12 pages.
USPTO Final Rejection for U.S. Appl. No. 11/864,137 dated May 16, 2012; 11 pages.
USPTO Final Rejection for U.S. Appl. No. 11/864,137 dated Aug. 29, 2011; 10 pages.
USPTO Final Rejection for U.S. Appl. No. 11/965,485 dated Apr. 13, 2011; 15 pages.
USPTO Final Rejection for U.S. Appl. No. 11/965,485 dated Sep. 24, 2012; 15 pages.
USPTO Non Final Rejection for U.S. Appl. No. 11/864,137 dated Dec. 4, 2013; 11 pages.
USPTO Non Final Rejection for U.S. Appl. No. 11/965,485 dated Apr. 12, 2013; 13 pages.
USPTO Non Final Rejection for U.S. Appl. No. 11/965,485 dated Jul. 5, 2012; 13 pages.
USPTO Non-Final Rejection for U.S. Appl. No. 11/855,281 dated Nov. 25, 2013; 13 pages.
USPTO Non-Final Rejection for U.S. Appl. No. 11/855,281 dated Jan. 22, 2013; 8 pages.
USPTO Non-Final Rejection for U.S. Appl. No. 11/855,281 dated Jul. 1, 2010; 10 pages.
USPTO Non-Final Rejection for U.S. Appl. No. 11/864,137 dated Jul. 7, 2010; 9 pages.
USPTO Non-Final Rejection for U.S. Appl. No. 11/864,137 dated Oct. 29, 2010; 10 pages.
USPTO Non-Final Rejection for U.S. Appl. No. 11/864,137 dated Dec. 21, 2011; 11 pages.
USPTO Non-Final Rejection for U.S. Appl. No. 11/965,485 dated Oct. 1, 2010; 12 pages.
USPTO Notice of Allowance for U.S. Appl. No. 11/965,485 dated Aug. 30, 2013; 9 pages.

* cited by examiner

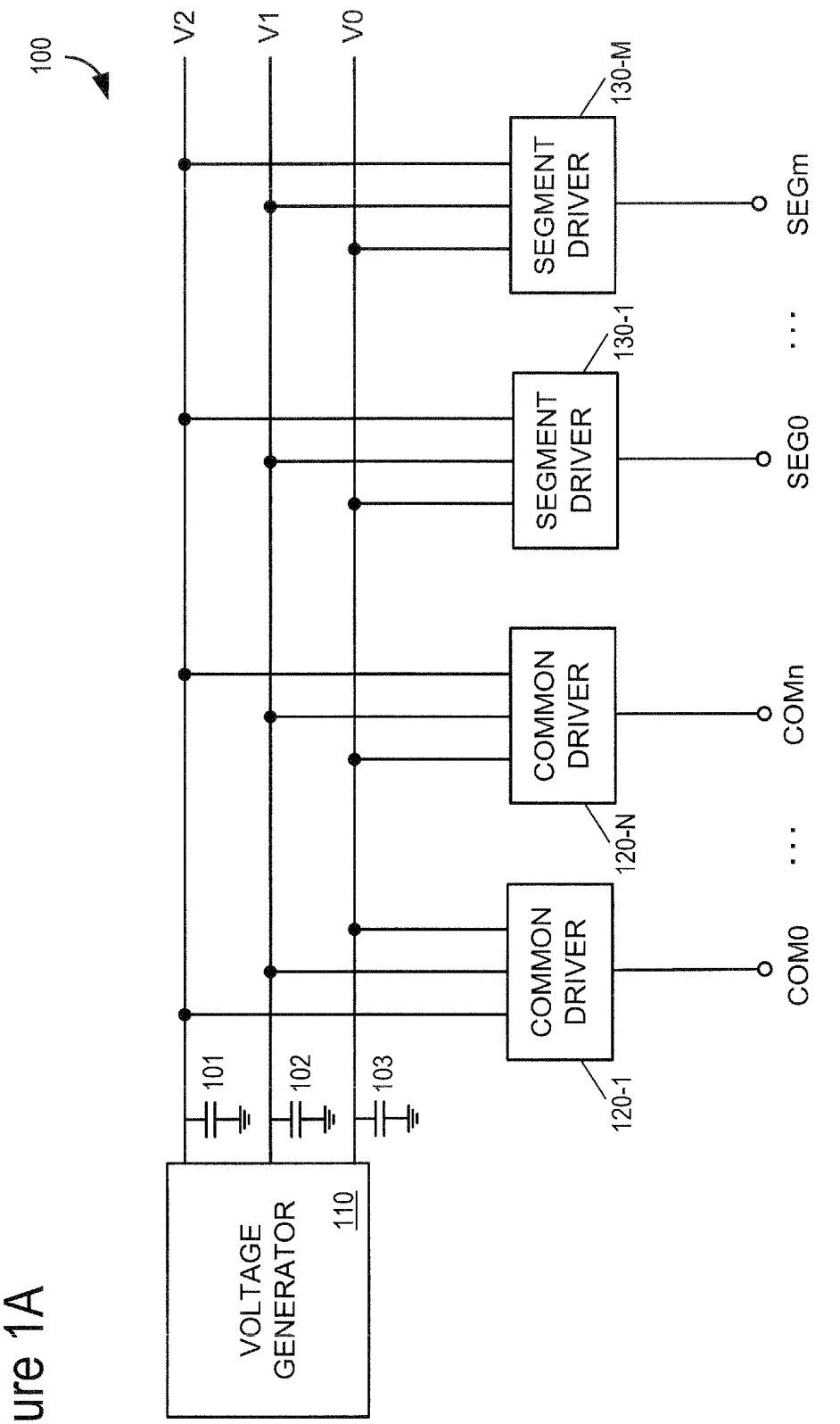
Figure 1A — Related Art

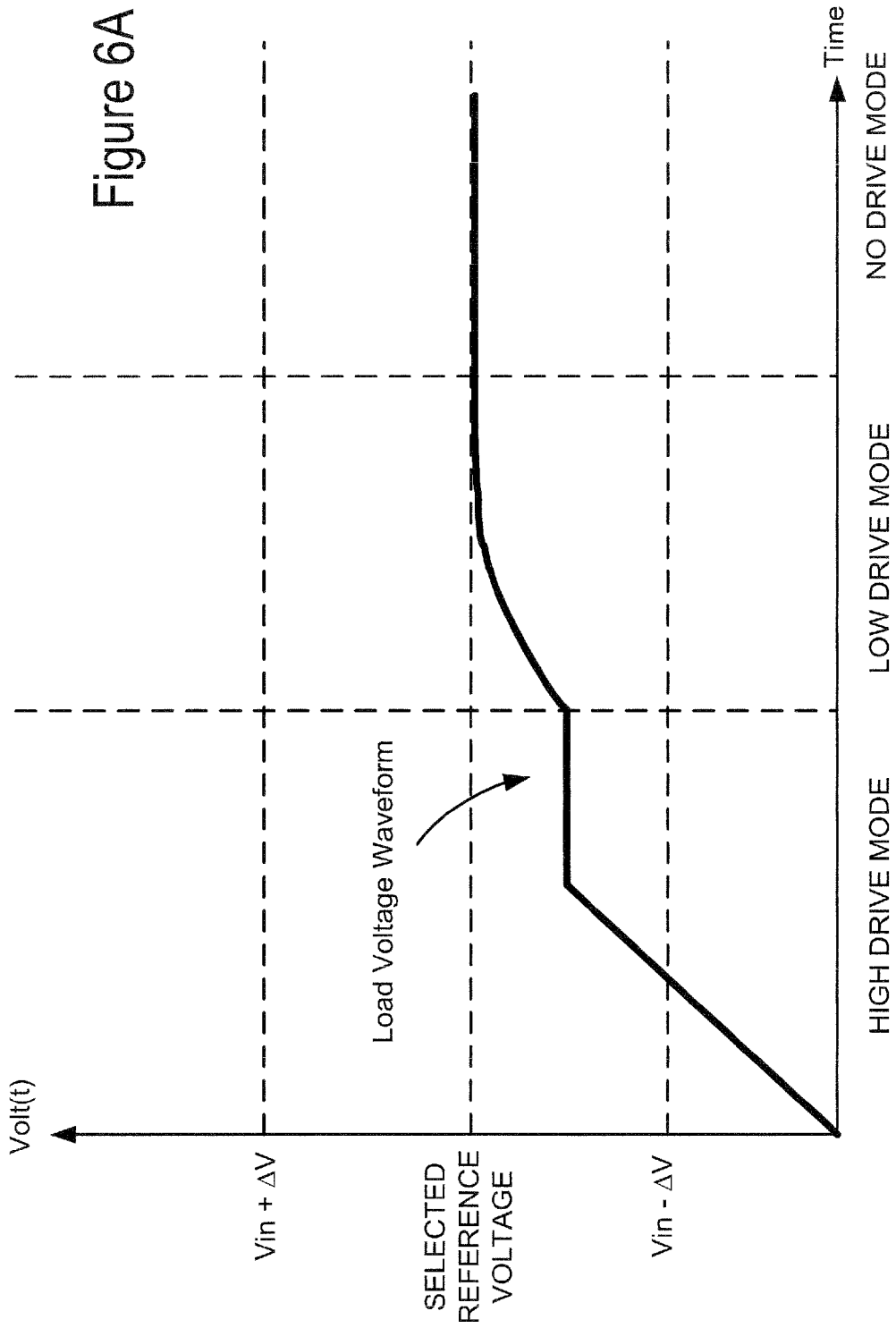

ACTIVE LIQUID CRYSTAL DISPLAY DRIVERS AND DUTY CYCLE OPERATION

RELATED APPLICATIONS

This application claims priority from U.S. Provisional Application No. 60/912,577, filed Apr. 18, 2007, which is incorporated herein by reference.

TECHNICAL FIELD

The present disclosure relates generally to electric circuits, and more particularly to driving passive liquid crystal displays (LCD).

BACKGROUND

Passive liquid crystal displays (LCDs) have become ubiquitous in today's display market, often incorporated into digital watches, calculators, etc. There are two primary types of passive liquid crystal displays, a segmented display having sections of liquid crystal material that can be arranged into a template or pattern which can form any numeral (and virtually any letter), and a passive matrix display in a row-column format where picture elements or pixels of liquid crystal material are located at intersections between the rows and columns.

These passive liquid crystal displays arrange liquid crystal material having a helical structure between a pair of glass panels embedded with electrodes, which are then enclosed by a pair of polarization filters. The helical structure of the liquid crystal material bends or rotates light entering the liquid crystal display through one of the polarization filters, such that it can substantially propagate through the other polarization filter, causing that section of the display to appear light gray to a user. When voltage is supplied to the electrodes of a section, however, the difference in the voltage causes liquid crystal molecules to begin to untwist from their helical structure and attempt to align with the electric field. When the voltage difference is large enough, the liquid crystal molecules become substantially untwisted and thus allow light to pass through unrotated, causing the polarizing filters to block the light from reaching the user, or appearing black.

FIG. 1A shows a conventional display driver 100. Referring to FIG. 1A, the conventional display driver 100 includes a voltage generator 110 to generate bias voltages V0, V1, and V2 and provide the bias voltages V0-V2 to a plurality of common drivers 120-1 to 120-N and a plurality of segment drivers 130-1 to 130-M. The common drivers 120-1 to 120-N and segment drivers 130-1 to 130-M provide one of the bias voltages V0-V2 and to a liquid crystal display (not shown) via output pins COM0-COMn and SEG0-SEGm, respectively. Each common pin-segment pin pair corresponds to a section of liquid crystal material that is untwisted (or not) according to the difference between selected voltages applied to the common pin-segment pin pair. For instance, a liquid crystal section corresponding to pins COM0 and SEG3 will untwist or not according to the difference in the voltage applied to the pins COM0 and SEG3, while a liquid crystal section corresponding to pins COM0 and SEGm will untwist or not according to the difference in the voltage applied to the pins COM0 and SEGm.

To avoid damaging the liquid crystal material during operation, the voltage applied to the electrodes or output pins must be alternated, typically with the common drivers 120-1 to 120-N and segment drivers 130-1 to 130-M selecting different voltages multiple times per frame. As such, a voltage response in a transient period of the voltage switching can reduce the voltage being applied to the output pins, thus lowering the voltage difference and affecting the color or gradation of gray displayed by the corresponding section in the LCD panel.

FIG. 1B shows a diagram of voltage switching in a conventional display driver 100. Referring to FIG. 1B, the diagram is a volts-versus-time graph showing a voltage waveform provided through at least one of the common drivers 120-1 to 120-N or segment drivers 130-1 to 130-M when switched between voltages V2 and V0. After each voltage switch, there is a transient period where the voltage approaches a steady state of V2 or V0.

When the actual voltage response is less than the ideal voltage response, the voltage difference perceived in the LCD panel is lower than expected. This reduced voltage difference causes liquid crystal molecules in the corresponding section(s) to untwist less, thus allowing light to propagate through the polarization filter to the user. In other words., conventionally the LCD panel section may not become black enough during this transient period.

To help increase the voltage response, the conventional display driver 100 utilizes low impendence switches in the common and segment drivers 120-1 to 120-N and 130-1 to 130-M, respectively. The low impedance switches can increase current to flow to the LCD panel, and thus increase the voltage response, bringing it closer to the ideal response shown in FIG. 1B. The conventional display driver 100 can also include several capacitors 101-103 corresponding to each bias voltage V0-V2 to improve the voltage response in the LCD panel. Low impendence switches and capacitors 101-103, however, consume a large amount of area on integrated circuits, which significantly increases the size and cost of the conventional display driver 100.

BRIEF DESCRIPTION OF THE DRAWINGS

The foregoing and other objects, advantages and features will become more readily apparent by reference to the following detailed description in conjunction with the accompanying drawings.

FIG. 1A shows a conventional display driver.

FIGS. 6A and 6B are example graphical representations of voltage waveforms generated by the liquid crystal display driver shown in FIG. 2.

SUMMARY

Figure 1B:
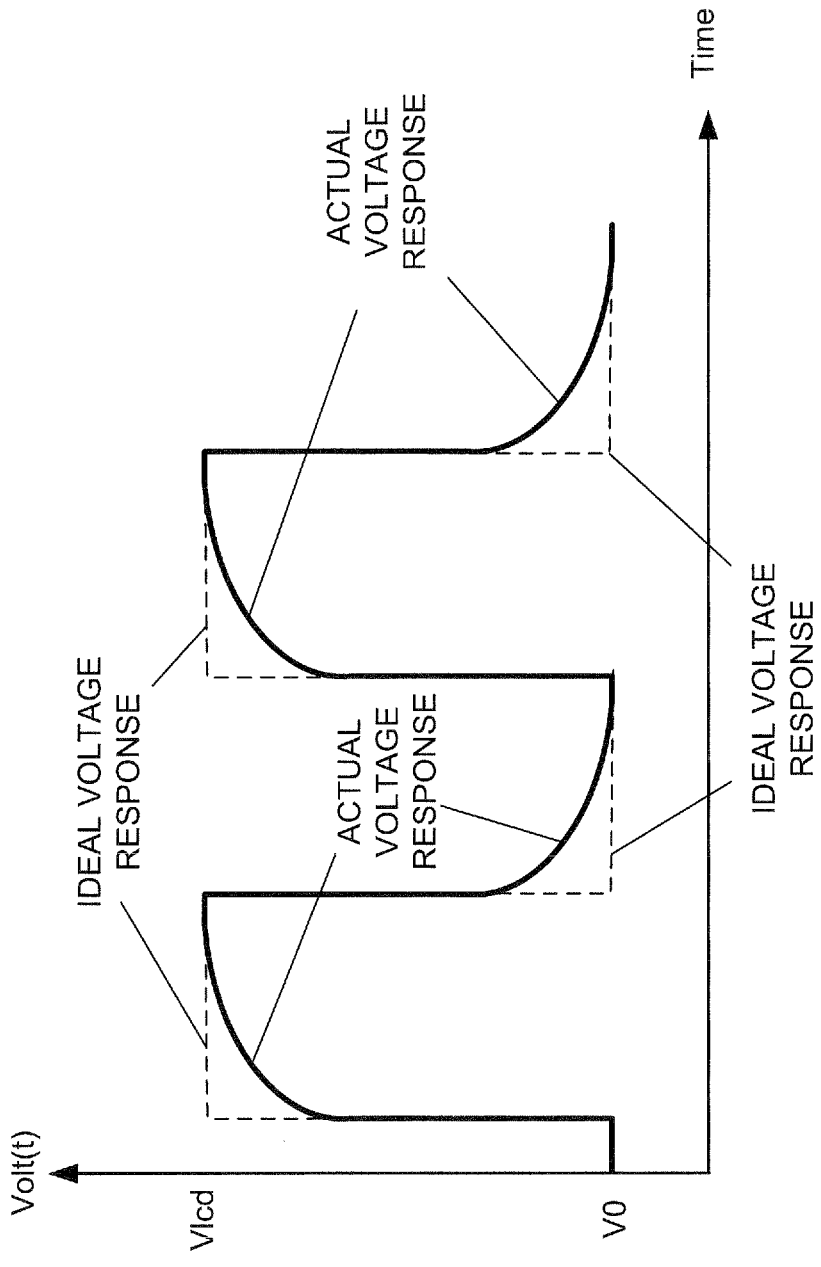
FIG. 1B shows a diagram of voltage switching in a conventional display driver.

A device comprising a reference voltage generator to generate a plurality of reference voltages, and a plurality of drive buffers to generate drive voltages according to at least one of the reference voltages, and to drive at least a portion of a liquid crystal display to present data according to the drive voltages.

At least one of the drive buffers included in the device includes a switch to receive one or more of the reference voltages from the reference voltage generator and to select at least one of the reference voltages, and an active driver to generate at least one of the drive voltages according to the reference voltages selected by the switch.

The active driver includes a high drive buffer to initially adjust the drive voltage towards the selected reference voltage. The high drive buffer included in the device to adjust the drive voltage to a value within a voltage window, the voltage window is a contiguous voltage range including a voltage level associated with the selected reference voltage.

The active driver includes a low drive buffer to adjust the drive voltage to substantially correspond to the selected reference voltage subsequent to the high drive buffer initially adjusting the drive voltage.

The active drive buffer operates in a no-drive mode responsive to the low drive buffer adjusting the load voltage to substantially correspond to the selected reference voltage. The reference voltage generator is turned off when the active driver operates is in the no-drive mode.

At least one of the drive buffers includes a multi-mode active driver capable of generating the drive voltage by initially operating in a high drive mode and then switching to a low drive mode.

A method, comprising selecting at least one of a plurality of reference voltages received from a reference voltage generator, generating one or more load voltages according to the selected reference voltage, and driving at least a portion of a liquid crystal display to present data according to the load voltages.

The generating of one or more load voltages according to the selected reference voltage includes initially adjusting the load voltage associated with the portion of the liquid crystal display towards the selected reference voltage while in a high drive mode.

The generating of one or more load voltages according to the selected reference voltage includes switching from the high drive mode to a low drive mode to adjust the load voltage to substantially correspond to the selected reference voltage.

The switching from the high drive mode to the low drive mode occurs when a voltage level associated with the load voltage is within a voltage window, where the voltage window is a range of voltage levels centered around the selected reference voltage and defined according to a preset offset value.

The method includes ceasing to drive the liquid crystal display after the load voltage substantially corresponds to the selected reference voltage during the low drive mode.

The method includes directing a reference voltage generator to cease generating the reference voltages after the load voltage substantially corresponds to the selected reference voltage.

A system comprising structure for selecting at least one of a plurality of reference voltages received from a reference voltage generator, structure for generating one or more load voltages according to the selected reference voltage, and structure for driving at least a portion of a liquid crystal display to present data according to the load voltages.

The structure for generating one or more load voltages according to the selected reference voltage includes structure for initially adjusting the load voltage associated with the portion of the liquid crystal display towards the selected reference voltage while in a high drive mode.

The structure for generating one or more load voltages according to the selected reference voltage includes structure for adjusting the load voltage to substantially correspond to the selected reference voltage in a low drive mode.

The structure for generating one or more load voltages switches from the high drive mode to the low drive when a voltage level associated with the load voltage is within a voltage window, the voltage window having a range of voltage levels centered around the selected reference voltage and defined according to a preset offset value.

The system includes structure for ceasing to drive the liquid crystal display after the load voltage substantially corresponds to the selected reference voltage during the low drive mode.

The system includes structure for directing the structure for generating the reference voltages to cease generating the reference voltages after the load voltage substantially corresponds to the selected reference voltage.

DETAILED DESCRIPTION

Figure 2:
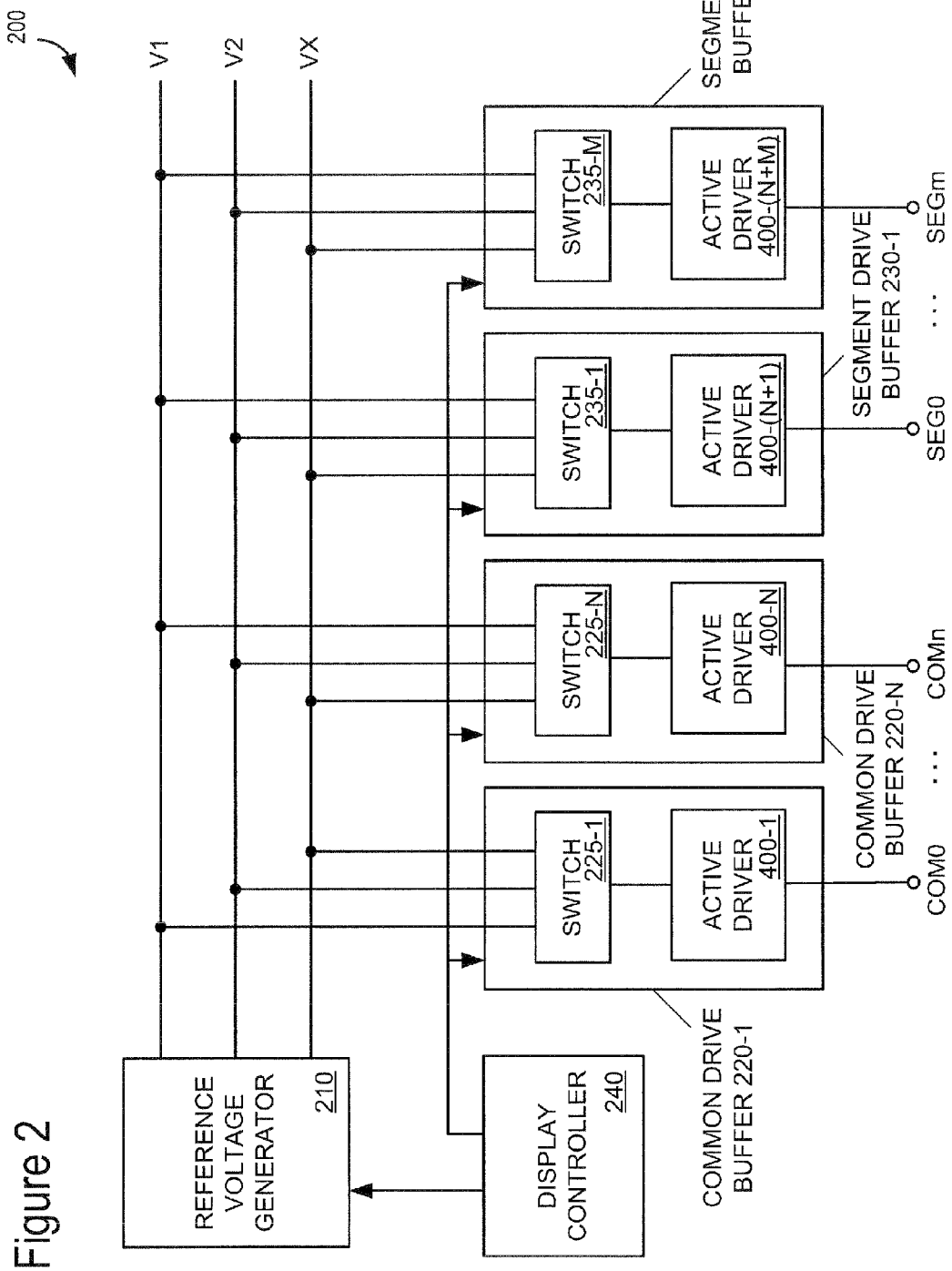
FIG. 2 is a block diagram illustrating example embodiments of a liquid crystal display driver.

FIG. 2 is a block diagram illustrating example embodiments of a liquid crystal display driver 200. It should be recognized that FIG. 2 may include other elements, which have not been illustrated in order to simplify the figures and which are not necessary to understand the example system disclosed below. The liquid crystal display driver 200 described and illustrated herein may be implemented in hardware, firmware, software, or any suitable combination thereof.

Referring to FIG. 2, the liquid crystal display driver 200 includes a reference voltage generator 210 to generate multiple reference voltages V1-Vx. In some embodiments, the reference voltages V1-Vx may be known as bias voltages. The reference voltages V1-Vx can each have a different voltage level, for example, reference voltage V1 can have the lowest voltage level, reference voltage Vx can have the highest voltage level, and reference voltage V2 can have an intermediate voltage level.

The liquid crystal display driver 200 includes a display controller 240 to control the operation of the reference voltage generator 210, i.e., direct the reference voltage generator 210 to generate a certain number of voltages at specified voltage levels and to shut-off the reference voltage generator 210 when applicable. Although FIG. 2 shows the reference voltage generator 210 outputting three reference voltages V1-Vx, in some embodiments, the reference voltage generator 210 can output any number of reference voltages with various voltage levels.

The liquid crystal display driver 200 includes a plurality of common drive buffers 220-1 to 220-N and a plurality of segment drive buffers 230-1 to 230-M to generate drive voltages that are provided to output pins COM0-COMn and SEG0-SEGm, respectively. The output pins COM0-COMn and SEG0-SEGm can provide the drive voltages to corresponding sections of a liquid crystal display panel (not shown) to control the presentation of digital data.

The common drivers 220-1 to 220-N and segment drivers 230-1 to 230-M can receive one or more of the reference voltages V1-Vx from the reference voltage generator 210. The common drivers 220-1 to 220-N can select one or more of the reference voltages V1-Vx received from the reference voltage generator 210 and generate drive voltages for common output pins COM0-COMn, respectively, according to the selected voltage. The segment drivers 230-1 to 230-M can select one or more of the reference voltages V1-Vx received from the reference voltage generator 210 and generate drive voltages for segment output pins SEG0-SEGm, respectively, according to the selected voltage.

The display controller 240 can direct the selection of the reference voltage and the generation of the drive voltages by the common drivers 220-1 to 220-N and segment drivers 230-1 to 230-M. The common drivers 220-1 to 220-N and segment drivers 230-1 to 230-M alternate the drive voltages supplied to the liquid crystal display panel, so as to not degrade its liquid crystal material. Embodiments of drive voltage waveforms will be described below in greater detail.

Figure 3:
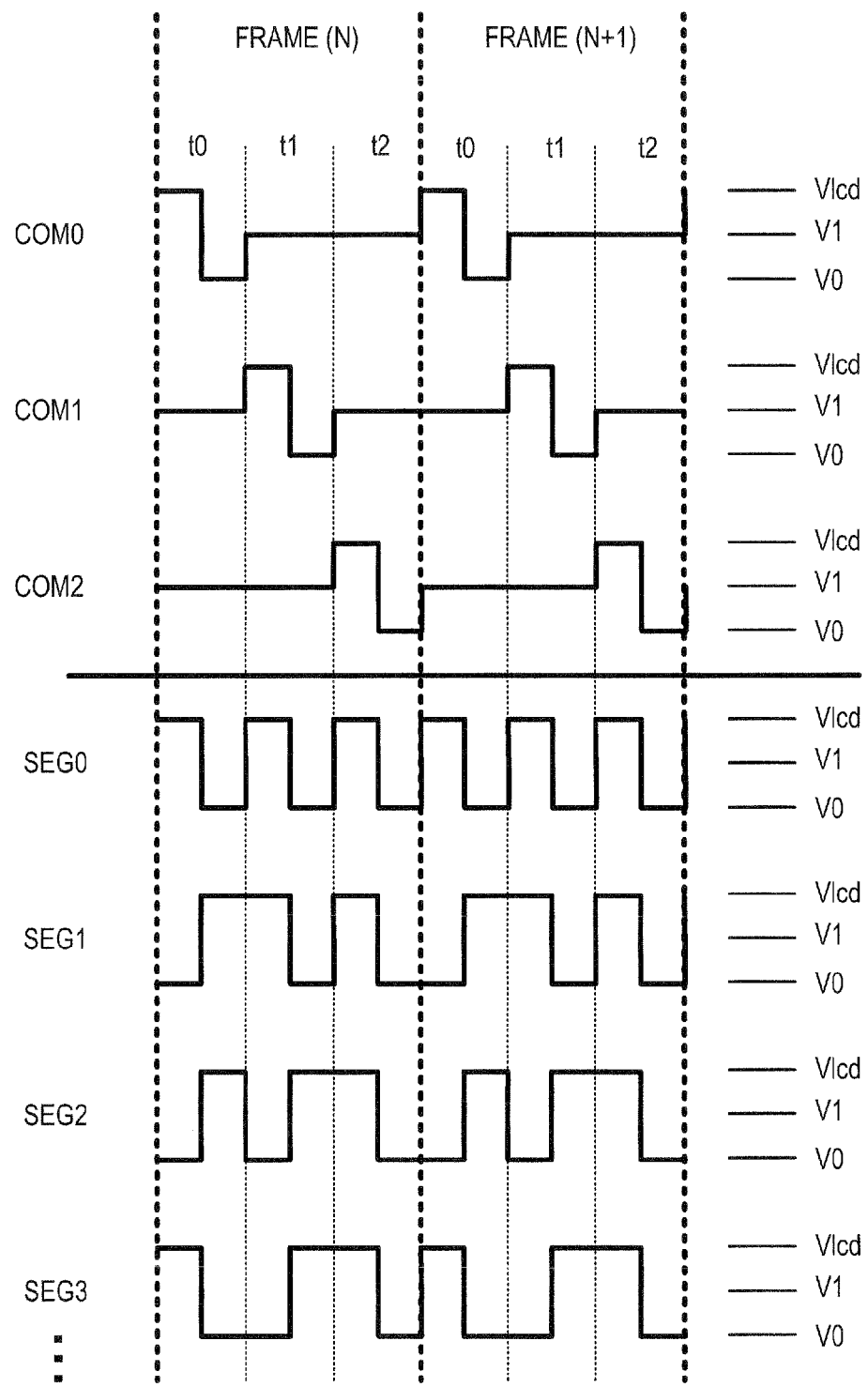
FIG. 3 is an example diagram of voltage waveforms generated by the liquid crystal display driver shown in FIG. 2.

FIG. 3 is an example diagram of voltage waveforms generated by the liquid crystal display driver 200 shown in FIG. 2. Referring to FIG. 3, the diagram shows an example a 3:1 multiplexed and ½ bias embodiment of voltage waveforms corresponding to the drive voltages generated by the common drivers 220-1 to 220-N and segment drivers 230-1 to 230-M. Multiplexing refers to the number of time divisions per frame, for example, frame(N) is separated into 3 time periods t0-t2 when utilizing the 3:1 multiplexing shown in FIG. 3. The bias refers to the number of common pins COM0-COMn associated with the liquid crystal display driver 200, for example, a ½ bias indicates that there are 3 common output pins COM0-COM2.

The diagram shows example waveforms of drive voltages over 2 successive frames, i.e., frame(N) and frame(N+1). The drive voltages for 3 common pins COM0-COM2 are shown along with drive voltages for 4 segment pins SEG0-SEG3. The common drive voltages associated with the common output pins COM0-COM2 can be set to voltage levels Vx, V1, or V0 in the embodiment shown in FIG. 3, while the segment drive voltages for segment pins SEG0-SEGm can be set to either voltage level Vx or V0. A voltage difference between drive voltages associated with the common pins and the segment pins controls the display of the LCD panel.

The voltage waveforms shown in FIG. 3 are known as type A waveforms with the drive voltages alternating in each time period t0-t2, for example, the drive voltage associated with common pin COM0 switches from Vx to V0 in the middle of time period to. In some embodiments, however, the liquid crystal display driver 200 can implement type B voltage waveforms where the drive voltage switch drive voltages between the time periods t0-t2, and remain substantially constant during the time periods t0-t2.

Referring back to FIG. 2, the common drive buffers 210-1 to 210-N include switches 225-1 to 225-N to select at least one of the reference voltages V1-Vx received from the reference voltage generator 210. The switches 225-1 to 225-N can provide the selected voltage to the corresponding active drivers 400-1 to 400-N where they may be buffered. The active drivers 400-1 to 400-N can generate drive voltages according to the selected voltage and provide them to the corresponding output pins COM0-COMn for use in driving the LCD panel.

The segment drive buffers 220-1 to 220-M include switches 235-1 to 235-M to select at least one of the reference voltages V1-Vx received from the reference voltage generator 210. The switches 235-1 to 235-M can provide the selected voltage to the corresponding active drivers 400-(N+1) to 400-(N+M) where they may be buffered. The active drivers 400-(N+1) to 400-(N+M) can generate drive voltages according to the selected voltage and provide them to the corresponding output pins SEG0-SEGm.

In some embodiments, the active drivers 400-1 to 400-M can have multiple modes of operation, such as a high drive mode, a low drive mode, and a no-drive mode. The display controller 240 can provide appropriate control signals to the active drivers 400-1 to 400-M to dictate which mode of operation, e.g., the high drive mode, the low drive mode, or the no-drive mode, for the active drivers 400-1 to 400-M. The timing associated with the control signals may be programmable for a dynamic switching between the modes or fixed depending on the particular load. In some embodiments, the active drivers 400-1 to 400-M may be implemented using two or more discrete drivers, while in other embodiments, the active drivers 400-1 to 400-M may be implemented using a single driver with two or more operational modes controllable by a bias current. Embodiments of the active drivers 400-1 to 400-M will be described below in greater detail.

Since the common drive buffers 210-1 to 210-N and segment drive buffers 220-1 to 220-M include active drivers 400-1 to 400-M that generate drive voltages, as opposed to directly using the reference voltages to drive the LCD panel, the liquid crystal display driver 200 gains the flexibility to incorporate high impedance switches into its design. Further, the liquid crystal display driver 200 can eliminate the need for external capacitors coupled to reference voltage generator 210. Since high impedance switches have a smaller footprint or consume less area on integrated circuits, and the removal of the need for external capacitors removes the need for space-consuming external pins/pads the utilization of the high impedance switches with the removal of the capacitors can reduce the overall size and cost of liquid crystal display driver IC 200.

Figure 4:
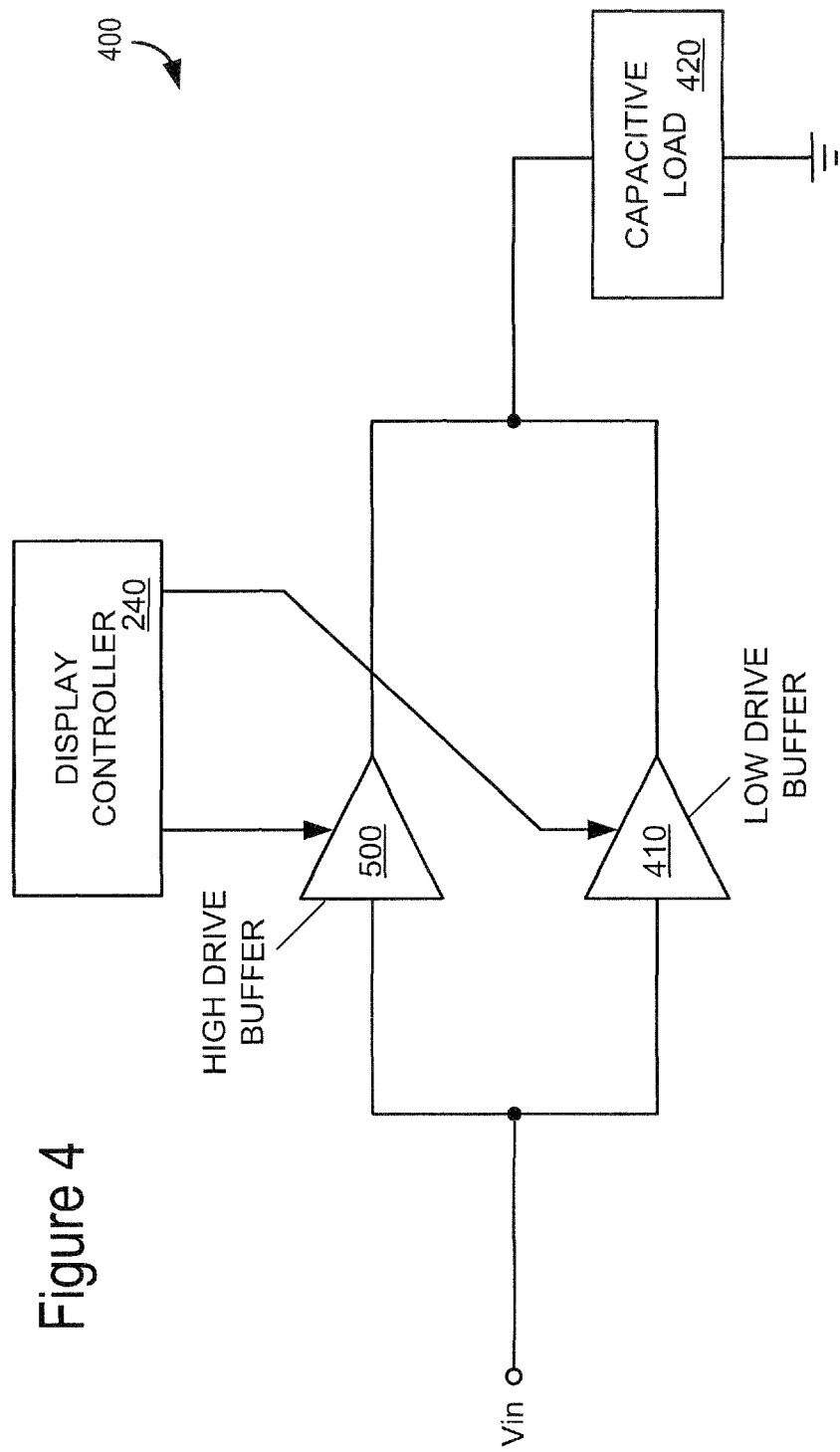
FIG. 4 is a block diagram illustrating an example active driver shown in FIG. 2.

FIG. 4 is a block diagram illustrating an example active driver 400-1 to 400-M shown in FIG. 2. Referring to FIG. 4, an example active driver 400 includes a high drive buffer 500 and a low drive buffer 410 to generate a drive voltage for the LCD panel that corresponds to the reference voltage selected by one of the switches 225-1 to 225-N or 235-1 to 235-M. Both the high drive buffer 500 and the low drive buffer 410 can raise or drop the level of the drive voltage to correspond to the selected reference voltage or Vin, but trade-off performance time for accuracy. For instance, the high drive buffer 500 can alter the level of the drive voltage more quickly than the low drive buffer 410, but will often do so with less accuracy. In some embodiments, the low drive circuit 410 may include a chopper-stabilized amplifier to provide an output voltage that accurately matches the input voltage of the active driver 400. Embodiments of high drive buffer 500 will be described below in greater detail.

The display controller 240 can generate appropriate control signals, to select which drive buffer 500 or 410 may be used to drive a substantially capacitive load 420, such as an LCD panel. The display controller 240 can also control the amount of time that each drive buffer 500 and 410 operates in each mode. The timing of the control signals may be programmable for a dynamic switching between the modes or fixed depending on the capacitive load 420. In some embodiments, the active drive buffer 200 may drive capacitive loads other than a LCD panel, as well as resistive loads and inductive loads.

The active driver 400 can initially utilize the high drive buffer 500 to drive the voltage towards the level of the selected reference voltage, and then switch over to the low drive buffer 410 to accurately set the drive voltage substantially at the level corresponding to the selected voltage. In some embodiments, the high drive buffer 500 can be utilized when the current level of the drive voltage is not within a range of the selected reference voltage. This range may have at least one corresponding voltage level threshold, that once the drive voltage crosses, causes a switch from the high drive buffer 500 to the low drive buffer 410. In some embodiments, once the low drive buffer 410 drives the level of the drive voltage to substantially correspond to the selected reference voltage, both the high drive buffer 500 and low drive buffer 410 can be turned off, for example, when a load 420 the drive voltages are driving is capacitive, such as the LCD panel.

By utilizing both a high drive buffer 500 and a low drive buffer 410 in generating corresponding drive voltages, the active driver 400 can quickly adjust the level of a drive voltage while maintaining accuracy once near the level of the selected reference voltage. Furthermore, by shutting-off the active buffer 400 and the reference voltage generator 210 once the drive voltage substantially corresponds to the selected reference voltage, the liquid crystal display driver 200 can reduce power consumption.

Figure 5:
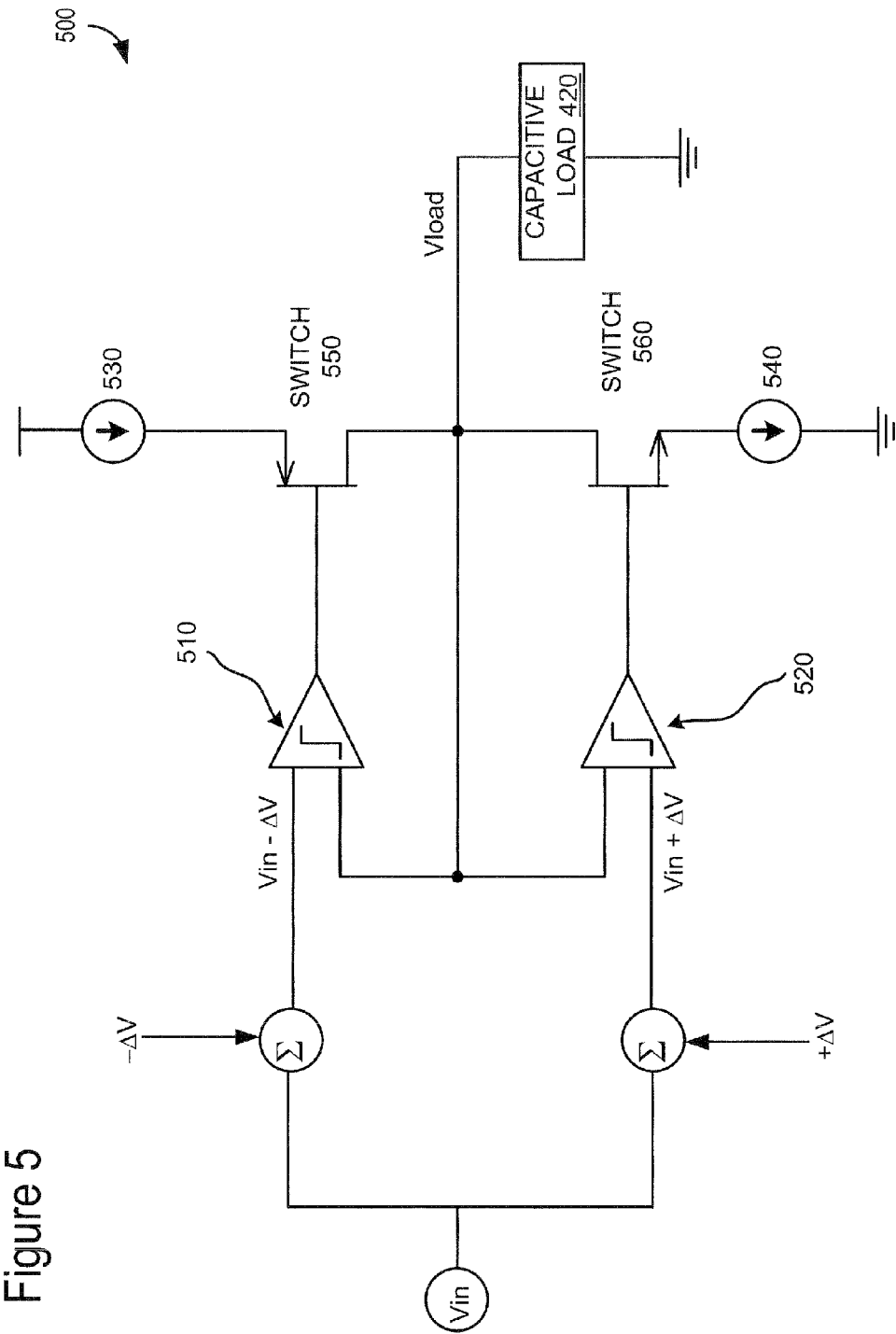
FIG. 5 is a block diagram illustrating an example high drive buffer shown in FIG. 4.

FIG. 5 is a block diagram illustrating an example high drive buffer 500 shown in FIG. 4. Referring to FIG. 5, the example high drive buffer 500 includes comparators 510 and 520, switches 550 and 560, current source 530 and current sink 540, to drive a load 420, such as the LCD panel. The comparators 510 and 520 can compare multiple voltages and switch their respective output to indicate which voltage is larger. The output of comparators 510 and 520 can control the operation of switches 550 and 560, respectively, with their output. In some embodiments, switch 550 may be a PMOS transistor, and switch 560 may be an NMOS transistor. In other embodiments, the switches 550 and 560 may be any other suitable device capable of performing the functions described herein.

The selected reference voltage or Vin represents an input voltage to the high drive circuit 500. The high drive buffer 500 can utilize a voltage window, e.g., the selected reference voltage Vin± an offset voltage ΔV or (Vin−ΔV, Vin+ΔV), to determine when to drive the capacitive load 420.

The comparator 510 compares the input voltage minus the offset voltage or Vin−ΔV with the load voltage Vload. In some embodiments, the comparator 510 outputs a "1" when Vin−ΔV is less than the load voltage Vload, thus directing the switch 550 to be turned off. Otherwise, the comparator 510 outputs a "0" when Vin−ΔV is greater than the load voltage Vload, thus directing the switch 500 to be turned on. When the switch 550 is turned on current from the current source 530 is allowed to propagate to the load 420 through the switch 550, thus charging the capacitive load 420 and raising the level of the load voltage Vload.

The comparator 520 can compare the value of the input voltage plus the offset voltage or Vin+ΔV with the load voltage Vload. When the load voltage Vload is less than Vin+ΔV, switch 560 is directed to be turned off. Otherwise, when the load voltage Vload is greater than Vin+ΔV the switch 540 is turned on. When the switch 560 is turned on the current sink 540 is allowed to discharge the capacitive load 420 and lower the level of the load voltage Vload.

When the active driver 400 is in a high drive mode and starting to drive the output voltage from a lower voltage to a higher voltage the switch 550 is on and the switch 560 is off, the current from the current source 530 will flow to load 420 and charge the load until the load voltage Vload reaches a value within the window (Vin−ΔV, Vin+ΔV). Once the load voltage Vload is charged to a value within the window (Vin−ΔV, Vin+ΔV), switch 550 may be turned Oil.

When the active driver 400 is in a high drive mode and starting to drive the output voltage from a higher voltage to a lower voltage the switch 550 is off and the switch 540 is on, the current from the current sink 540 will flow from load 420 and discharge the load until the load voltage Vload reaches a value within the window (Vin−ΔV, Vin+ΔV). Once the load voltage Vload is discharged to a value within the window (Vin−ΔV, Vin+ΔV), switch 560 may be turned off.

Figure 6B:
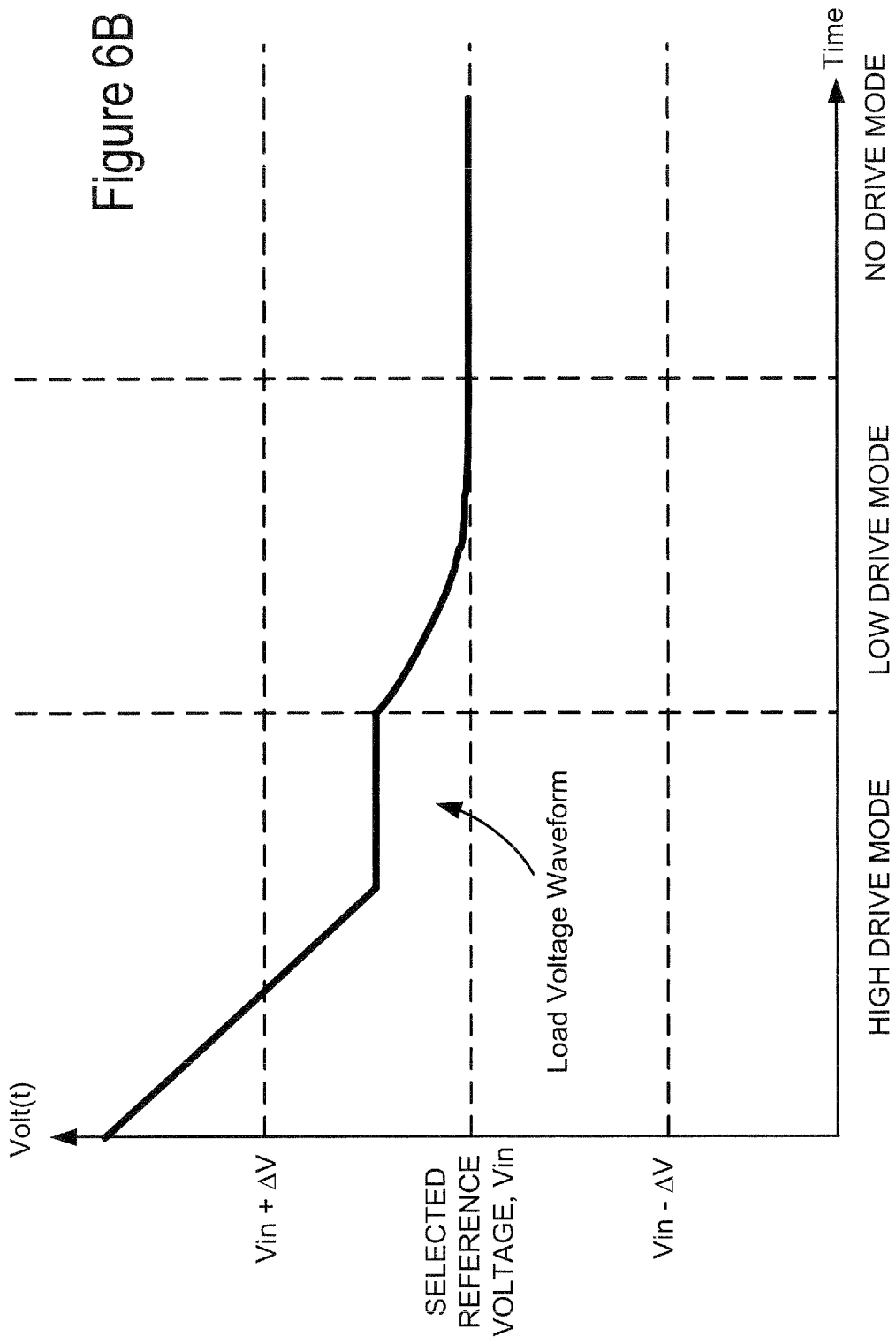

FIGS. 6A and 6B are example graphical representations of voltage waveforms generated by the liquid crystal display driver 200 shown in FIG. 2. Referring to FIGS. 6A and 6B, a load voltage, e.g., for the capacitive load 420, is shown over a time period after the liquid crystal display driver 200 switches the selected reference voltage Vin in at least one of the switches 225-1 to 225-N or 235-1 to 235-N. In FIG. 6A, the load voltage waveform initially has a voltage level below that of the selected reference voltage Vin, and the liquid crystal display driver 200 can drive the voltage corresponding to the capacitive load 420 to the substantially correspond to the level of the selected reference voltage Vin. In FIG. 6B, the load voltage waveform initially has a voltage level above that of the selected reference voltage Vin, and the liquid crystal display driver 200 can drive the voltage corresponding to the capacitive load 420 to the substantially correspond to the level of the selected reference voltage Vin. In some embodiments, the selected reference voltage Vin may be one of the selected bias voltages V1, V2, and Vx, or a combination thereof.

The active driver 400 may initially operate in a high-drive mode and drive the load voltage towards the selected reference voltage Vin and then switch over to a low-drive mode to more accurately set the load voltage to substantially correspond to the selected reference voltage Vin. The high-drive mode allows the active driver 400 to rapidly alter the load voltage, i.e., by providing a large amount of current to the capacitive load 420, but, in some embodiments, the rapid voltage response may be at the cost of accuracy. The low-drive mode allows the active driver 400 to accurately alter the load voltage, but, in some embodiments, with a slower voltage response. This allows the liquid crystal display driver 200 to quickly alter the load voltage of an LCD panel when a new reference voltage is selected, and then accurately set the load voltage to substantially correspond to the selected load voltage.

In some embodiments, the active driver 400 while operating in the high-drive mode can drive the load voltage within a voltage window. The voltage window can be a contiguous voltage range that includes the selected reference voltage Vin. In some embodiments, the voltage window can be the selected reference voltage Vin plus or minus an offset voltage ΔV, or (Vin−ΔV, Vin+ΔV). The offset voltage ΔV can be a relatively small voltage compared to the input voltage Vin and can be programmable or fixed according to various embodiments.

Once the active driver 400 elevates the load voltage to a voltage level within voltage window (Vin−ΔV, Vin+ΔV), for example, or drives the load voltage past Vin−ΔV, the active driver 400 can switch to the low-drive mode and continue drive the load voltage towards the selected reference voltage Vin.

In some embodiments, after the load voltage substantially corresponds to the selected reference voltage Vin, the liquid crystal display driver 400 may remain in the low drive mode until there is another switch in the selected reference voltage Vin. By utilizing both the high drive low drive mode, a bias current in the active driver 400 may operate in a low current mode, which allows for less power consumption. In other embodiments, after the load voltage substantially corresponds to the selected reference voltage Vin, the liquid crystal display driver 400 may switched to a no-drive mode, in which the high-drive buffer 400, the low-drive buffer 450, and the reference voltage generator 20 may be turned off to further reduce power consumption.

Further modifications and alternative embodiments of this invention will be apparent to those skilled in the art in view of this description. For example, the active driver 400 may be implemented using two discrete drivers or alternatively be implemented using a single driver with two modes by changing the bias current of the driver between a high mode and a low mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. A device, comprising:
a reference voltage generator configured to generate a plurality of reference voltages;
a plurality of drive buffers configured to generate drive voltages according to at least one of the reference voltages, and to drive at least a portion of a display to present data according to the drive voltages, wherein at least one of the drive buffers comprises:
a switch configured to receive one or more of the reference voltages from the reference voltage generator and to select at least one of the reference voltages; and
an active driver configured to generate at least one of the drive voltages by actively driving the at least one of the drive voltages at an output of the active driver toward the at least one of the reference voltages selected by the switch;
wherein the active driver is configured to (1) initially adjust the at least one of the drive voltages to a value within a voltage window, wherein the voltage window is a voltage range including the at least one of the reference voltages selected by the switch, and (2) set the at least one drive voltage to substantially correspond to the selected reference voltage subsequent to initially adjusting the at least one drive voltage to the value within the voltage window.

2. The device of claim 1, wherein the active driver includes a high drive buffer configured to initially adjust the at least one of the drive voltages towards the selected reference voltage.

3. The device of claim 2, wherein the high drive buffer is configured to adjust the at least one of the drive voltages to the value within the voltage window.

4. The device of claim 2, where the active driver includes a low drive buffer configured to adjust the drive voltage to substantially correspond to the selected reference voltage subsequent to the high drive buffer initially adjusting the drive voltage.

5. The device of claim 4, wherein the active driver is configured to operate in a no-drive mode in response to the low drive buffer adjusting the load voltage to substantially correspond to the selected reference voltage.

6. The device of claim 5, where the reference voltage generator is turned off when the active driver operates in the no-drive mode.

7. The device of claim 1, wherein the display is a passive liquid crystal display.

8. A method, comprising:
selecting at least one of a plurality of reference voltages received from a reference voltage generator;
generating one or more load voltages by actively driving the one or more load voltages toward the selected reference voltage, wherein actively driving the one or more load voltages includes (1) initially adjusting at least one load voltage of the load voltages to a value within a voltage window, wherein the voltage window is a voltage range including the selected reference voltage, and (2) setting the at least one load voltage to substantially correspond to the selected reference voltage subsequent to initially adjusting the at least one load voltage to the value within the voltage window; and
driving at least a portion of a liquid crystal display to present data according to the load voltages.

9. The method of claim 8 where generating one or more load voltages according to the selected reference voltage includes initially adjusting the load voltage associated with the portion of the liquid crystal display towards the selected reference voltage while in a high drive mode.

10. The method of claim 9 where generating one or more load voltages according to the selected reference voltage includes switching from the high drive mode to a low drive mode to adjust the load voltage to substantially correspond to the selected reference voltage.

11. The method of claim 10, wherein the switching from the high drive mode to the low drive mode occurs when a voltage level associated with the load voltage is within the voltage window, wherein the voltage window is defined according to a preset offset value.

12. The method of claim 10 includes ceasing to drive the liquid crystal display after the load voltage substantially corresponds to the selected reference voltage during the low drive mode.

13. The method of claim 12 further including directing the reference voltage generator to cease generating the reference voltages after the load voltage substantially corresponds to the selected reference voltage.

14. A system, comprising:
a drive buffer configured to select at least one of a plurality of reference voltages received from a reference voltage generator;
an active driver configured to generate one or more load voltages by actively driving the one or more load voltages toward the selected reference voltage, wherein the active driver is configured to operate in a no-drive mode responsive to the one or more load voltages having been adjusted to substantially correspond to the selected reference voltage, and wherein in the no-drive mode generation of the plurality of reference voltages is ceased after the one or more load voltages have been adjusted to substantially correspond to the selected reference voltage; and
a display driver configured to drive at least a portion of a display to present data according to the load voltages.

15. The system of claim 14, wherein the active driver includes a high drive buffer configured to initially adjust a load voltage associated with the portion of the display towards the selected reference voltage while in a high drive mode.

16. The system of claim 15, wherein the active driver includes a low drive buffer configured to adjust the load voltage to substantially correspond to the selected reference voltage in a low drive mode.

17. The system of claim 16, wherein the active driver switches from the high drive mode to the low drive when a voltage level associated with the load voltage is within a voltage window, the voltage window having a range of voltage levels centered around the selected reference voltage and defined according to a preset offset value.

18. The system of claim 16 further comprising a display controller configured to control the operation of the reference voltage generator.

19. The system of claim 18, wherein the display controller is configured to direct the reference voltage generator to cease generating the reference voltages after the load voltage substantially corresponds to the selected reference voltage.

* * * * *